United States Patent [19]

Katti et al.

[11] Patent Number: 5,375,082

[45] Date of Patent: Dec. 20, 1994

[54] INTEGRATED, NONVOLATILE, HIGH-SPEED ANALOG RANDOM ACCESS MEMORY

[75] Inventors: Romney R. Katti, Pasadena; Jiin-Chuan Wu, San Gabriel; Henry L. Stadler, La Canada, all of Calif.

[73] Assignee: The United States of America as represented by the Administrator of the National Aeronautics and Space Administration, Washington, D.C.

[21] Appl. No.: 129,001

[22] Filed: Sep. 24, 1993

Related U.S. Application Data

[63] Continuation of Ser. No. 653,578, Feb. 11, 1991, abandoned.

[51] Int. Cl.$^5$ .................. G11C 27/00; G11C 11/14
[52] U.S. Cl. ............................. 365/45; 365/48; 365/145; 365/171; 365/158
[58] Field of Search .................. 365/45, 48, 145, 158, 365/171

[56] References Cited

U.S. PATENT DOCUMENTS

| | | | |
|---|---|---|---|
| 3,577,134 | 5/1971 | Bergman | 340/174 |
| 4,259,728 | 3/1981 | Geary et al. | 365/45 |
| 4,360,899 | 11/1982 | Dimyan et al. | 365/171 |
| 4,455,626 | 6/1984 | Lutes | 365/158 |
| 4,722,073 | 1/1988 | Lampe et al. | 365/87 |
| 4,731,757 | 3/1988 | Daughton et al. | 365/173 |
| 4,780,848 | 10/1988 | Daughton et al. | 365/173 |
| 4,831,427 | 5/1989 | Coleman, Jr. | 357/27 |
| 5,173,873 | 12/1992 | Wu et al. | 365/158 |

Primary Examiner—Rolf Hille
Assistant Examiner—Peter Toby Brown
Attorney, Agent, or Firm—John H. Kusmiss; Thomas H. Jones; Guy M. Miller

[57] ABSTRACT

This invention provides an integrated, non-volatile, high-speed random access memory. A magnetically switchable ferromagnetic or ferrimagnetic layer is sandwiched between an electrical conductor which provides the ability to magnetize the magnetically switchable layer and a magnetoresistive or Hall effect material which allows sensing the magnetic field which emanates from the magnetization of the magnetically switchable layer. By using this integrated three-layer form, the writing process, which is controlled by the conductor, is separated from the storage medium in the magnetic layer and from the readback process which is controlled by the magnetoresistive layer. A circuit for implementing the memory in CMOS or the like is disclosed.

21 Claims, 3 Drawing Sheets

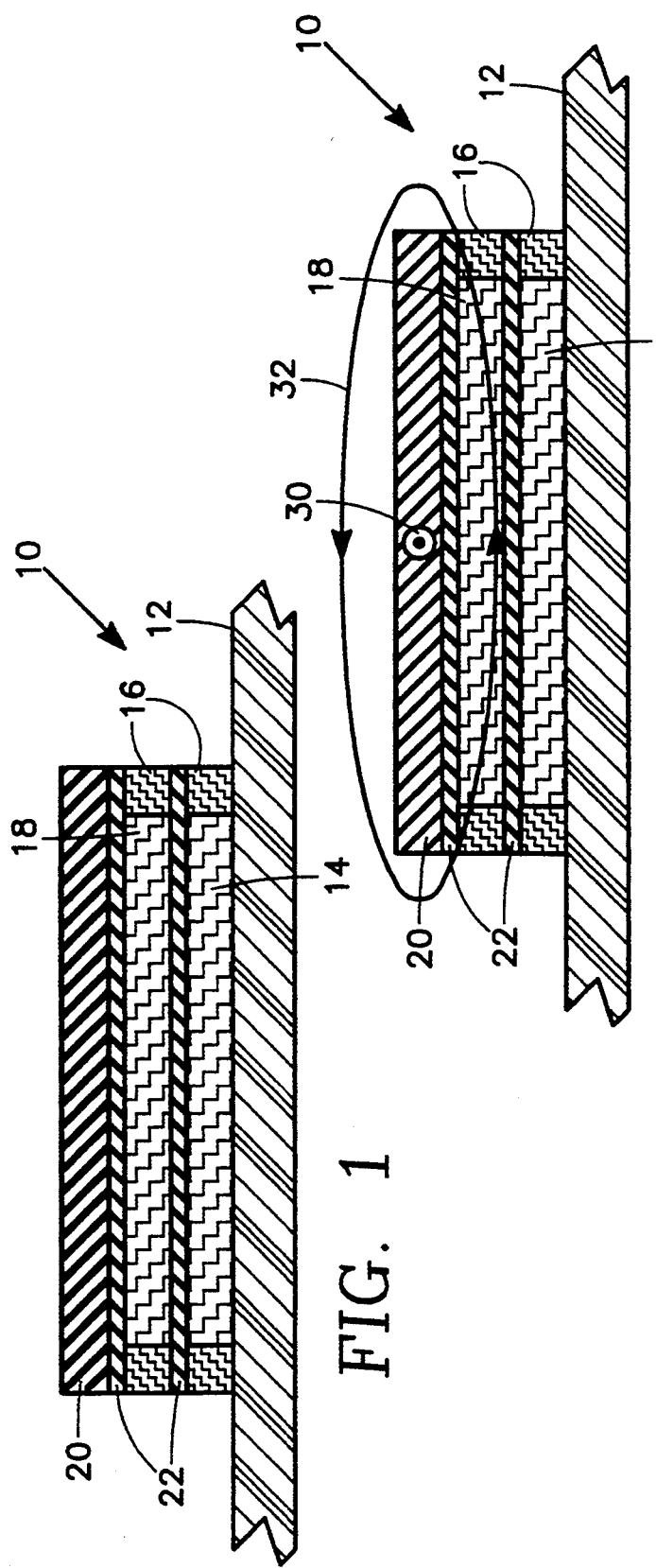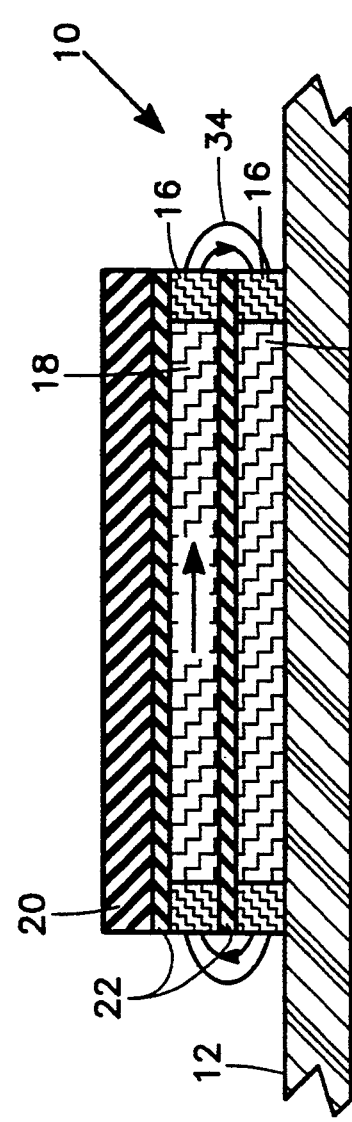

INTEGRATED, NONVOLATILE, HIGH-SPEED ANALOG RANDOM ACCESS MEMORY

This application is a continuation of application Ser. No. 07/653,578, filed Feb. 11, 1991 and now abandoned.

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to computer memories and, more particularly, to an integrated, non-volatile, high-speed random access memory. In particular, it relates to an analog memory for the storing and reading out of analog data comprising, a substrate; a plurality of individually addressable memory cells each of which comprises, a sensing layer disposed on the substrate, the sensing layer being of a material which exhibits changing electrical properties as a function of magnetic flux passing therethrough, the sensing layer including electrical connections at which the changing electrical properties thereof can be sensed, a magnetizable layer disposed on the sensing layer, the magnetizable layer being of a material which is magnetizable in degrees, a conductive layer of an electrically conductive material disposed on the magnetizable layer, the conductive layer including electrical connections thereto for passing an electrical current through the conductive layer to create a magnetic field through the magnetizable layer of a preselected flux level whereby the magnetizable layer is magnetized to a level associated with an analog value which can then be read in a non-destructive manner by sensing the electrical properties of the sensing layer; write current generation means for generating currents through the conductive layer of selected ones of the memory cells to magnetize the magnetizable layer thereof to pre-selected flux levels whereby to store a value therein; and, reading means for sensing the electrical properties of the sensing layer of selected ones of the memory cells whereby to read a value stored therein.

Preferably, a first insulating layer is disposed between the magnetizable layer and the sensing layer; and, a second insulating layer is disposed between the conductive layer and the magnetizable layer.

In the preferred embodiment, the magnetizable layer is a sputtered layer comprising a mixture of different sized particles which magnetize at different flux levels.

In one possible embodiment, the sensing layer is comprised of a magnetoresistive material. In another possible embodiment, the sensing layer is comprised of a material exhibiting Hall effect characteristics.

In one possible embodiment, the write current generation means comprises means for first applying a saturating current through the conductive layer followed by a reverse current of a controlled magnitude. In another possible embodiment, the write current generation means comprises means for first applying an AC-demagnetization current through the conductive layer followed by a DC current of a controlled magnitude. In this second embodiment, the AC-demagnetization current may comprise a sinusoidal current with a decaying envelope.

In the preferred embodiment, a first confining peripheral layer of a high magnetically permeable material is disposed to channel magnetic flux into the magnetizable layer and a second confining peripheral layer of the highly magnetically permeable material is disposed to channel magnetic flux into the sensing layer.

BACKGROUND ART

In the field of computers, binary memory is common. In binary memory, of course, each "bit" is either a 1 or a 0 and, therefore, to represent data that can have $2^n$ states, "n" bits are required. Thus, one bit can have two states (i.e. $2^1$), two bits can be used to represent four states (i.e. $2^2$), and so forth. Analog memory would provide the ability to represent many more states in a smaller space. For example, if each "bit" could have four setable and detectable states, four bits of memory could represent 256 states (i.e. $4^4$) instead of the sixteen states that four binary bits can assume (i.e. $2^4$).

The need for analog memory is known in the art and attempts have no doubt been made by those skilled in the art to arrive at a viable analog memory structure. To the best of the knowledge of the inventors herein, no successful analog memory has been reported. Moreover, since the primary usefulness for analog memory is in instances where space, weight, etc. are principal considerations (such as space applications), a successful analog memory must also be able to function in the hostile environments such applications provide. The need for analog memory is also exhibited in special purpose computing applications, such as artificial neural networks.

In reviewing the background art available in the field, the inventor herein noted several prior U.S. patents which disclosed memory structures which, in some case, could be misinterpreted as being the same as the analog memory structure of the present inventors to be described hereinafter. In the interest of putting such misinterpretations to rest at an early stage of this disclosure so that the novelty of the present invention will be readily apparent, a brief commentary on several of these patents follows hereinafter.

Lutes (U.S. Pat. No. 4,455,626)—While the Lutes memory appears to propose a structure similar to that of the present invention, those skilled in the art will recognize that the Lutes memory is (and can only be) a binary memory. As will be described in detail with respect to the disclosure of the present invention hereinafter, the choice of materials and structure of the Lutes memory is such as to require more layers and a more complex implementation process. Most important, however, the materials employed simply could not function as a viable analog memory.

Dimyan (U.S. Pat. No. 4,360,899)—This is definitely a binary memory and could not be an analog memory.

Bergman (U.S. Pat. No. 3,577,134)—Bergman discusses a multilayer memory; but, with emphasis on binary storage with DRO/NDRO operation. There is no discussion of analog memory capabilities.

Lampe (U.S. Pat. No. 4,722,073)—Like Dimyan, this is definitely a binary memory and could not be an analog memory.

Coleman (U.S. Pat. No. 4,831,427)—This memory uses a transistor structure where the gate is ferromagnetic in place of standard conductors. As will be seen from the discussion of the present invention which follows, this is completely different from the structure of this invention where transistors which are standard CMOS implementations in tandem are used with an analog memory cell.

Daughton (U.S. Pat. No. 4,731,757)—This disclosure is definitely a binary memory and the geometry and materials employed are not suitable for implementing analog memory. Also, there is no explicit use of embedded transistors as in the memory elements of the present invention.

Daughton (U.S. Pat. No. 4,780,848)—This later Daughton disclosure makes no use of transistors in tandem as in the memory elements of the present invention. Moreover, the memory geometry and the materials employed do not appear to be useful for implementing analog memory.

STATEMENT OF THE INVENTION

Accordingly, it is an object of this invention to provide an analog memory cell which is viable to use commercially.

It is another object of this invention to provide an analog memory cell which can be integrated into standard CMOS technology or the like.

It is still another object of this invention to provide a method for operating and energizing an analog memory cell which provides for sure and repeatable setting of the memory cell at its discrete levels of operation.

It is yet another object of this invention to provide an analog memory cell which can be formed of materials which will withstand space operations and similar harsh environments without malfunctioning.

It is a further object of this invention to provide an integrated, solid-state, analog, random-access memory exhibiting an access time of less than 100 nanoseconds and having a high density of greater than 1 megabit per square centimeter.

It is still further object of this invention to provide an integrated, solid-state, analog, random-access memory which is non-volatile, radiation hard, and of low power.

Other objects and benefits of this invention will become apparent from the detailed description which follows hereinafter when taken in conjunction with the drawing figures which accompany it.

BRIEF DESCRIPTION OF THE DRAWINGS

FIG. 1 is a simplified drawing depicting a computer memory according to the present invention.

FIG. 2 illustrates the write process performed in the memory of FIG. 1.

FIG. 3 illustrates the read process performed in the memory of FIG. 1.

DETAILED DESCRIPTION OF THE INVENTION

Figure 4:
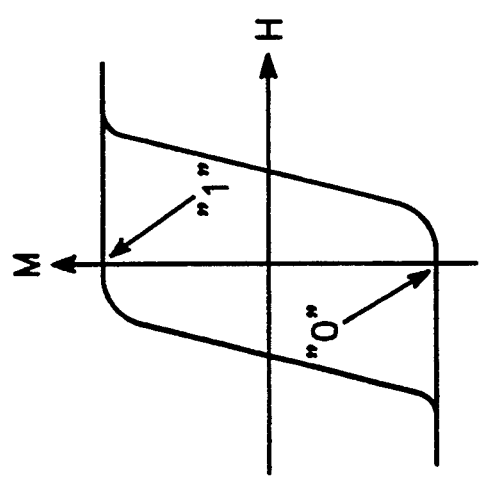
FIG. 4 is a hysteresis curve characteristic of a magnetic material of the prior art.

Analog recording using magnetic materials is known in the art. Unfortunately, the type of magnetic recording available is not adaptable for random-access applications in a computer environment. The typical prior art analog recording technique is one employing an anhysteretic recording process such as with magnetic tape recorders, and the like, which are mechanical systems which use motors to move a tape having a magnetizable surface thereon across a recording head and which typically offer average access times to data greater than ten seconds. By contrast, in the high-speed, integrated, analog, random-access memory (ARAM) of the present invention, a magnetically switchable ferromagnetic or ferrimagnetic layer is sandwiched between an electrical conductor, which provides the ability to magnetize the magnetically switchable layer, and a magnetoresistive material, which allows sensing of the magnetic field which emanates from the magnetization of the magnetically switchable layer. In the preferred embodiment, a highly magnetically permeable material is deposited around the layers of magnetically switchable material and magnetoresistive material to improve the channeling of magnetic flux. This construction is shown in simplified form in FIG. 1 where the ARAM is generally indicated as 10. The ARAM 10 is formed on a substrate 12 employing conventional integrated circuit techniques as are known in the art. Certain aspects which are unique to the ARAM 10 of this invention will be addressed in greater detail shortly. The ARAM 10 comprises a layer of magnetoresistive material 14 contained within a confining peripheral layer of a highly magnetically permeable material 16 over which there is a layer of magnetically switchable ferromagnetic or ferrimagnetic material 18, which is also contained within a confining peripheral layer of the highly magnetically permeable material 16. A conductor layer 20 is deposited over the layer of ferromagnetic or ferrimagnetic material 18.

By using this integrated three-layer form, the writing process (as depicted in FIG. 2), which is controlled by passing a current through the conductor layer 20, is separated from the storage medium in the magnetic layer (i.e. the layer of ferromagnetic or ferrimagnetic material 18) and from the readback process, which is controlled by the layer of magnetoresistive material 14. Fast access times, non-volatility, and radiation hardness are achieved with this structure and these materials employing conventional fabrication techniques well known to those skilled in the art. High storage density and low power utilization are achieved by a preferred memory architecture which will be addressed in detail shortly.

Returning to the basic structure of FIG. 1 with greater specificity, the substrate 12 should be one which provides rigidity, thermal conductivity, and lattice matching or other characteristics which offer suitability for processing including semiconductor processing. The three layers are separated by an insulating material 22 such as silicon dioxide. The conductor layer 20 can be made of aluminum or an aluminum-copper alloy, for example, which passes current and thereby creates a magnetic field.

The layer of ferromagnetic or ferrimagnetic material 18 is actually the key to the operability of the present invention and, therefore, warrants greater attention and detail. In the typical magnetic recording device intended for magnetically recording data as a series of 1's and 0's, the magnetic material is applied to the surface of the tape, floppy disk, or other supporting structure as a homogeneous layer which has a hysteresis curve such as that depicted in FIG. 4; that is, the magnetic layer exhibits bi-stable characteristics. If it is magnetized in one direction, it will remain magnetized in that direction until sufficient magnetic flux passes through it (as from a write head) in the opposite magnetic direction. At that time, it will flip to the opposite magnetic polarity until changed by the same process. Reading of the layer is, therefore, simply the process of moving the layer over a coil (as contained in the read head) whereby a current signal is induced in one direction and then the other as a function of the direction of magnetization of the adjacent "bits" of the magnetic layer as it passes across the read head. Thus, as depicted in FIG. 4, each bit position of the magnetic layer is either a magnetic "1" or a magnetic "0".

Figure 5:
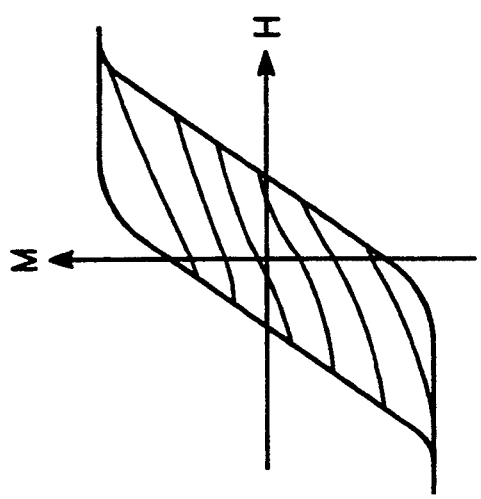
FIG. 5 is a hysteresis curve generated using a saturating current and a magnetic material in accordance with the invention.
Figure 6:
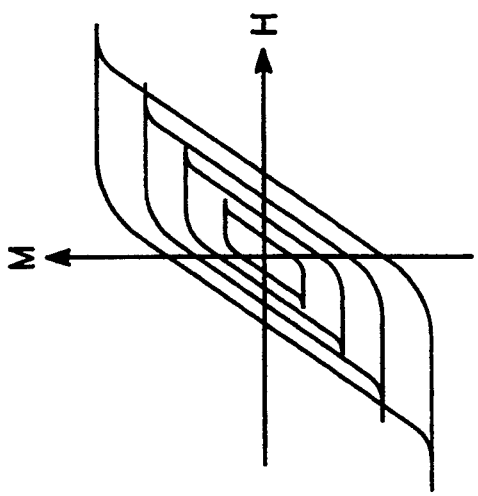
FIG. 6 is a hysteresis curve characteristic of AC-demagnetization achieved in magnetic material in accordance with the invention.
Figure 7:
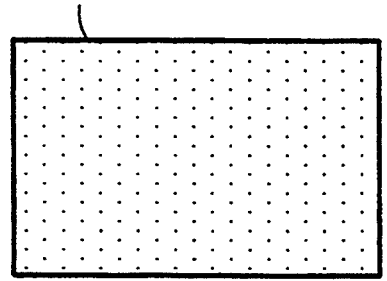
FIG. 7 depicts magnetic material of the prior art corresponding to the hysteresis curve of FIG. 4.
Figure 8:
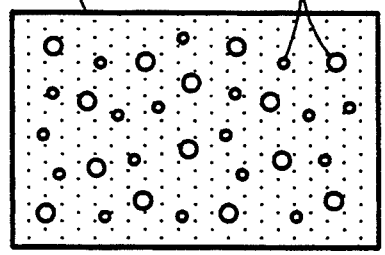
FIG. 8 depicts magnetic material behavior in accordance with the present invention.

The layer of ferromagnetic or ferrimagnetic material 18 of the present invention, by contrast, exhibits characteristics such as those depicted in FIGS. 5 and 6; that is, the material 18 can be magnetized to degrees with each degree of magnetization comprising a value or state which is detectable when reading the memory cell. The key to this ability is the manner in which the material 18 is applied to form its layer in the overall ARAM 10. A preferred technique is to form the layer of material 18 employing sputtered gamma-$Fe_2O_3$, which has a selectable coercivity and remanent and saturation magnetizations which characterize the major loop such that minor loops are readily generated and accessed. The reason for this can be recognized from the simplified drawings of FIGS. 7 and 8. The prior art magnetic material which has the characteristic hysteresis curve of FIG. 4 is as depicted in FIG. 7; that is, it is comprised of a homogeneous layer of magnetic material 24, all of which reacts according to the same hysteresis curve. By contrast, the sputtered magnetic material 26 of this invention as depicted in FIG. 8 comprises a homogeneous mixture of particles 28 of different sizes, each size exhibiting a unique hysteresis characteristic with respect to its magnetizability. The overall magnetic characteristic exhibited by the layer of sputtered material 26 is, therefore, the magnetic sum of the individual particles 28 thereof. As will be seen shortly, this is further controlled in a unique manner by the novel manner of writing of the present invention to be described shortly.

The layer of magnetoresistive material 14 acts as a sensor and can be comprised of any material which exhibits sensible characteristics which change as a function of magnetic field from the material 18 passing therethrough. Thus, InSb or Bismuth, or perhaps NiFe or NiFeCo, could be employed to obtain a sensible magnetoresistive effect; but, a Hall effect sensor such as InSb could also be employed within the scope and spirit of the present invention. The confining peripheral layer of the highly magnetically permeable material 16 can comprise, for example, NiFe-permalloy with the dimensions thereof selected to optimize its function in the particular implementation of assisting in channeling the magnetic flux to the layers wherein it is to be utilized for writing and reading.

The principle of the writing operation is depicted in simplified form in FIG. 2. When a current 30 is passed through the conductor layer 20, a solenoidal magnetic field 32 is generated. A current 30 with the indicated vectorial sense generates the magnetic field 32 with a sense as shown in FIG. 2. By issuing a suitable current, the remanent magnetization can be selected to be between positive and negative remanence. The highly permeable material 16 is used to assist in channeling flux to the particles 28.

The principle of the reading operation is depicted in simplified form in FIG. 3. If the magnetic material 18 is magnetized as shown in FIG. 3, then a demagnetizing field 34 with a sense as shown is generated. Again, the highly permeable material 16 is used to assist in channeling flux into the layer of magnetoresistive material 14. The magnitude of the demagnetizing field 34 induces a change in resistance of the layer of magnetoresistive material 14 which can be measured as a voltage when a current is passed through the layer of magnetoresistive material 14. Alternatively, as mentioned above, the demagnetizing field 34 can be used to induce a measurable voltage when a current is passed through the layer of material 14 so that the Hall effect can be utilized.

Figure 9:
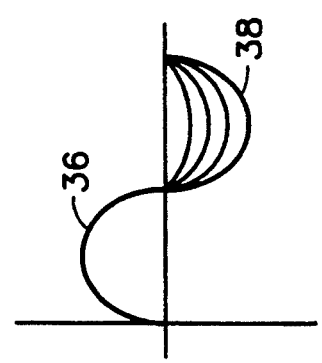
FIG. 9 illustrates a saturating current technique of the present invention corresponding to the hysteresis curve of FIG. 5.
Figure 10:
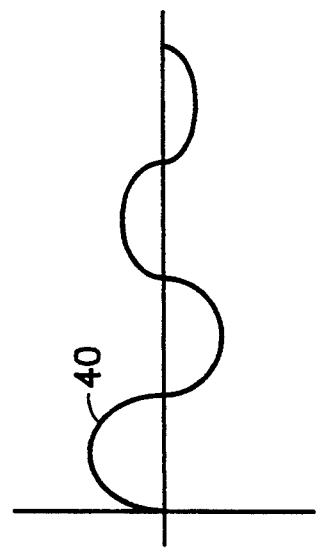
FIG. 10 illustrates an AC-demagnetization technique corresponding to the hysteresis curve of FIG. 6 in accordance with the present invention.

As those skilled in the art should appreciate by now, in the ARAM 10 of this invention the storage of analog information is based on storing information in the remanent state of the switchable layer of magnetic material 18, whose minor loops allow accessing remanent magnetization between negative and positive remanence. As depicted in FIGS. 5 and 9, these minor loops can be accessed by applying a saturating current 36 followed by a reverse current 38 of a controlled magnitude. As depicted in FIGS. 6 and 10 (and the preferred approach because of its greater control), the switchable layer of magnetic material 18 may be demagnetized first using an AC-demagnetization (as could be induced by a sinusoidal current 40 with a sufficiently slowing decaying envelope) and then magnetized along its initial magnetization curve to a desired value so that when the magnetizing current, and hence the field, is removed the desired remanent magnetization is acquired.

Figure 11:
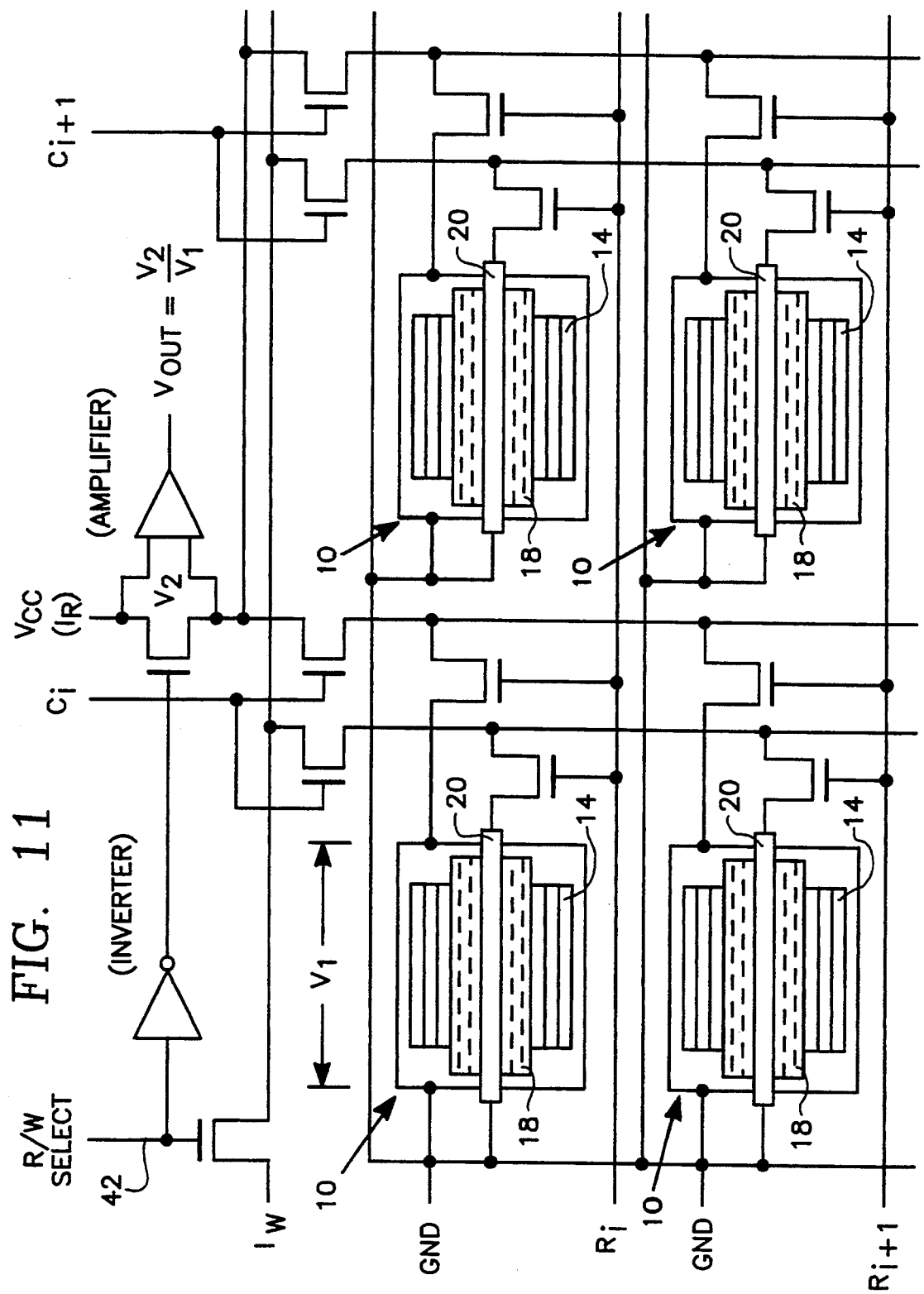
FIG. 11 illustrates an integrated circuit embodying the present invention.

An integrated circuit chip layout for implementing the ARAM 10 in a preferred manner is shown in FIG. 11. As those skilled in the art will readily recognize and appreciate, during the write process the R/W-Select line 42 is activated so that the selected writing current passes toward the memory cells, while the read current is inhibited. For purposes of an example, assume that the particular memory cell which is to be addressed is in row $R_i$ and Column $C_i$, at coordinates ($R_i$, $C_i$). When the pass transistors at cell ($R_i$, $C_i$) are activated, the writing current is uniquely gated to cell ($R_i$, $C_i$) and that memory cell is subjected to the magnetic field from the current which places its magnetization in a new memory remanence state. During the read process, the writing line is disabled and the selected transistors at address ($R_i$, $C_i$) allow the read current to pass to that cell's sensor. A load transistor is provided (which, in practice, may need to become a series of two or more transistors for optimal resistance and power matching and dissipation) whose voltage output can be amplified and used to detect the magnetization state of the cell. The difference between the ARAM 10 of this invention and prior art binary memory cells that may appear to be similar can be appreciated from the fact that in such prior art binary memory cells, the writing operation is accomplished by applying one-half of a write current along all of the cells in one column and the other one-half of the write current along all of the cells in one row of the memory. The only memory cell which has sufficient current to "write" the cell is the cell at the intersection which receives both halves of the current. By contrast, in the ARAM 10 of this invention, as described above each cell must have the full proper write current directed to it exclusively.

Wherefore, having thus described the present invention, what is claimed is:

1. An analog memory cell for storing analog data, and reading out said analog data with an electronic readout circuit, the analog memory cell comprising:
   a) a substrate;
   b) a sensing layer disposed on said substrate, said sensing layer being of a material which exhibits changing electrical properties as a function of magnetic flux passing therethrough, said sensing layer including electrical connections connected to said electronic readout circuit at which said changing electrical properties thereof can be sensed;
   c) a magnetizable layer disposed over said sensing layer, said magnetizable layer being of a material which comprises a mixture of particles having a distribution of substantially different sizes; and,
   d) a conductive layer of an electrically conductive material disposed over said magnetizable layer, said conductive layer including electrical connections thereto for passing an electrical current through said conductive layer to create a magnetic field through said magnetizable layer of a preselected one of plural flux levels; wherein,
   e) said distribution of substantially different said particles has respective size ranges such that the particles in said respective size ranges are either magnetized or demagnetized at a respective one of said plural flux levels thereby imparting one of plural overall magnetization levels to the magnetizable layer corresponding to said respective one of said plural flux levels; and,
   f) said respective size ranges sufficiently differ from each other so that each one of said plural overall magnetization levels is discretely detectable by said readout electronics in a non-destructive manner by sensing said electrical properties of said sensing layer.

2. The analog memory cell of claim 1 wherein:
   a) a first insulating layer is disposed between said magnetizable layer and said sensing layer; and,
   b) a second insulating layer is disposed between said conductive layer and said magnetizable layer.

3. The analog memory cell of claim 1 wherein: said sensing layer is comprised of a magnetoresistive material.

4. The analog memory cell of claim 1 wherein: said sensing layer is comprised of a material exhibiting a Hall effect such that a measurable voltage is induced when a current is passed through said material.

5. The analog memory cell of claim 1 and additionally comprising:
   write current generation means connected to said electrical connections of said conductive layer for generating currents through said conductive layer which magnetize said magnetizable layer to preselected flux levels.

6. The analog memory cell of claim 5 wherein: said write current generation means comprises means for first applying a saturating current through said conductive layer followed by a reverse current of a controlled magnitude.

7. The analog memory cell of claim 5 wherein: said write current generation means comprises means for first applying an AC-demagnetization current through said conductive layer followed by a DC current of a controlled magnitude.

8. The analog memory cell of claim 7 wherein: said AC-demagnetization current comprises a sinusoidal current with a decaying envelope.

9. The analog memory cell of claim 1 and additionally comprising:
   a first confining peripheral layer of a highly magnetically permeable material disposed to channel magnetic flux into said magnetizable layer.

10. The analog memory cell of claim 9 and additionally comprising:
    a second confining peripheral layer of a highly magnetically permeable material disposed to channel magnetic flux into said sensing layer.

11. The analog memory cell of claim 1 wherein:
    a) said plural flux levels comprise more than two flux levels; and,
    b) said plural magnetization levels comprise more than two discretely detectable magnetization levels.

12. An analog memory for the storing and reading out of analog data comprising:
    a) a substrate:
    b) a plurality of individually addressable memory cells each of which comprises,
       b1) a sensing layer disposed on said substrate, said sensing layer being of a material which exhibits changing electrical properties as a function of magnetic flux passing therethrough, said sensing layer including electrical connections at which said changing electrical properties thereof can be sensed,
       b2) a magnetizable layer disposed over said sensing layer, said magnetizable layer being of a material which comprises a mixture of particles having a distribution of substantially different sizes,
       b3) a conductive layer of an electrically conductive material disposed over said magnetizable layer, said conductive layer including electrical connections thereto for passing an electrical current through said conductive layer to create a magnetic field through said magnetizable layer of a preselected one of plural flux levels, wherein,
       b4) said distribution of substantially different sized particles has respective size ranges such that the particles in said respective size ranges are either magnetized or demagnetized at a respective one of said plural flux levels thereby imparting one of plural overall magnetization levels to the magnetizable layer corresponding to said respective one of said plural flux levels; and,
       b5) said respective size ranges sufficiently differ from each other so that each one of said plural overall magnetization levels is discretely detectable by said readout electronics in a non-destructive manner by sensing said electrical properties of said sensing layer;
    c) write current generation means for generating currents through said conductive layer of selected ones of said memory cells whereby to store a value therein; and, d) reading means for sensing said electrical properties of said sensing layer of selected ones of said memory cells whereby to read a value stored therein.

13. The analog memory of claim 12 wherein in each memory cell:

a) a first insulating layer is disposed between said magnetizable layer and said sensing layer; and, b) a second insulating layer is disposed between said conductive layer and said magnetizable layer.

14. The analog memory of claim 12 wherein in each memory cell:

said sensing layer is comprised of a magnetoresistive material.

15. The analog memory of claim 12 wherein in each memory cell:

said sensing layer is comprised of a material exhibiting a Hall effect such that a measurable voltage is induced when a current is passed through said material.

16. The analog memory of claim 12 wherein:

said write current generation means comprises means for first applying a saturating current through a said conductive layer followed by a reverse current of a controlled magnitude.

17. The analog memory of claim 12 wherein:

said write current generation means comprises means for first applying an AC-demagnetization current through a said conductive layer followed by a DC current of a controlled magnitude.

18. The analog memory of claim 17 wherein:

said AC-demagnetization current comprises a sinusoidal current with a decaying envelope.

19. The analog memory of claim 12 and additionally comprising in each memory cell:

a first confining peripheral layer of a highly magnetically permeable material disposed to channel magnetic flux into said magnetizable layer thereof.

20. The analog memory of claim 19 and additionally comprising in each memory cell:

a second confining peripheral layer of a highly magnetically permeable material disposed to channel magnetic flux into said sensing layer thereof.

21. The analog memory of claim 12 wherein:

a) said plural flux levels comprise more than two flux levels; and, b) said plural overall magnetization levels comprise more than two discretely detectable magnetization levels.

* * * * *